(12) United States Patent
Chang et al.

(10) Patent No.: US 7,474,549 B2
(45) Date of Patent: Jan. 6, 2009

(54) BIT-LINE EQUALIZER, SEMICONDUCTOR MEMORY DEVICE INCLUDING THE SAME, AND METHOD FOR MANUFACTURING BIT-LINE EQUALIZER

(75) Inventors: Soo-bong Chang, Seoul (KR); Jung-hwa Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 34 days.

(21) Appl. No.: 11/756,725

(22) Filed: Jun. 1, 2007

(65) Prior Publication Data

US 2008/0062790 A1    Mar. 13, 2008

(30) Foreign Application Priority Data

Aug. 8, 2006    (KR) ............... 10-2006-0074874

(51) Int. Cl.
G11C 5/06    (2006.01)
(52) U.S. Cl. .................... 365/63; 365/202; 365/203
(58) Field of Classification Search ............... 365/63, 365/202, 203
See application file for complete search history.

(56) References Cited

U.S. PATENT DOCUMENTS 6,115,279 A * 9/2000 Kitsukawa et al. ............ 365/63
6,785,176 B2    8/2004 Demone

FOREIGN PATENT DOCUMENTS

| JP | 62-115861 | 5/1987 |
|----|-----------|--------|
| JP | 2000-138355 | 5/2000 |
| JP | 2004-140344 | 5/2004 |
| KR | 2001-0084023 | 9/2001 |
| KR | 2002-0068772 | 8/2002 |
| KR | 1020040102723 A | 12/2004 |
| KR | 10-1999-0048397 | 9/2005 |

OTHER PUBLICATIONS

Abstract 100518510 B1 corresponds to KR 10-1999-0048397.

* cited by examiner

Primary Examiner—VanThu Nguyen
(74) Attorney, Agent, or Firm—F. Chau & Assoc., LLC

(57) ABSTRACT

A bit-line equalizer, a semiconductor memory device including the bit-line equalizer, and a method for manufacturing the bit-line equalizer, in which the bit-line equalizer includes: first and second polysilicon gates formed in a first direction in proximity to each other, the first and second polysilicon gates having a predetermined distance between them; and a plurality of equalizing transistors formed in a second direction along the first and second polysilicon gates, the equalizing transistors equalizing bit-line pairs, with the equalizing transistors being alternately formed in proximity to the first and second polysilicon gates. The bit-line equalizer can vary the widths of the equalizing transistors irrespective of a memory cell pitch in order to improve an equalizing time.

22 Claims, 3 Drawing Sheets

US 7,474,549 B2

BIT-LINE EQUALIZER, SEMICONDUCTOR MEMORY DEVICE INCLUDING THE SAME, AND METHOD FOR MANUFACTURING BIT-LINE EQUALIZER

CROSS-REFERENCE TO RELATED PATENT APPLICATION

This application claims the benefit of Korean Patent Application No. 10-2006-0074874, filed on Aug. 8, 2006, in the Korean Intellectual Property Office, the disclosure of which is incorporated herein in its entirety by reference.

BACKGROUND OF THE INVENTION

1. Technical Field

The present disclosure relates to a semiconductor memory device and, more particularly, a bit-line equalizer capable of varying the width of an equalizing transistor irrespective of a memory cell pitch, a semiconductor memory device including the bit-line equalizer, and a method for manufacturing the bit-line equalizer.

2. Discussion of Related Art

A semiconductor memory device such as a dynamic random access memory (DRAM) includes a plurality of memory cell arrays each having a plurality of memory cells storing data and a plurality of sense amplifiers sensing and amplifying the data stored in the memory cells. The plurality of memory cell arrays and the plurality of sense amplifiers are alternately arranged. Each of the sense amplifiers is connected to a bit-line and an inverted bit-line, senses data signals on the bit-line and the inverted bit-line, and amplifies the sensed data signals. The operation of sensing and amplifying the data signals will be explained in detail.

The bit-line and the inverted bit-line are precharged with a predetermined bit-line voltage before a wordline is enabled. When the wordline is enabled, a cell transistor of a memory cell is turned on and charge-sharing occurs between a cell capacitor of the memory cell and the bit-line, so that a data signal corresponding to data stored in the memory cell is applied to the bit-line.

The sense amplifier senses a difference between the bit-line voltage of the precharged inverted bit-line and the data signal of the bit line and amplifies the difference to read the data stored in the memory cell. Here, the difference is a small value and, thus, it is necessary to precharge the bit-line and the inverted bit-line with the same bit-line voltage and to maintain the bit-line voltage. For this operation, the sense amplifiers include a bit-line equalizer.

FIG. 1 is a circuit diagram of a conventional bit-line equalizer 100. While the bit-line equalizer is included in a semiconductor memory device employing an open bit-line structure in FIG. 1, it will be understood by those of ordinary skill in the art that the bit-line equalizer illustrated in FIG. 1 can be included in semiconductor memory devices using other bit-line structures.

The bit-line equalizer 100 includes a plurality of sub-equalizers EQ0, EQ2, ... respectively corresponding to bit-line pairs respectively composed of bit-lines BL0, BL2, ... and inverted bit-lines /BL0, /BL2, .... Each of the sub-equalizers EQ0, EQ2, ... includes three MOS transistors N1, N2 and N3 controlled in response to an equalization enable signal EQ_CTRL. The sub-equalizers EQ0, EQ2, ... form an equalizer EQ.

Specifically, the sub-equalizer EQ0 includes precharge transistors N1 and N2 and an equalizing transistor N3. The precharge transistors N1 and N2 precharge the bit-line BL0 and the inverted bit-line /BL0 with a bit-line voltage VBL in response to the equalization enable signal. The equalizing transistor N3 equalizes the bit-line BL0 and the inverted bit-line /BL0 in response to the equalization enable signal such that both the bit-line BL0 and the inverted bit-line /BL0 are maintained at the bit-line voltage VBL.

FIG. 2 is a layout of a bit-line equalizer 200 showing more bit lines than the equalizer 100 illustrated in FIG. 1. In FIG. 2, the right part is a memory cell array area MEM_AREA and the left part is a sensing and amplification area SA_AREA.

Referring to FIG. 2, the bit-line equalizer 200 includes a transistor active region ACTIVE_TR, a polysilicon gate GP formed on the active region ACTIVE_TR, bit-line pairs BL0 and /BL0, BL2 and /BL2, ..., a plurality of contact holes for connecting the bit-line pairs BL0 and /BL0, BL2 and /BL2, ... to the active region ACTIVE_TR, and a plurality of contact holes for supplying the bit-line voltage VBL to the active region ACTIVE_TR.

As illustrated in FIG. 1, the equalizing transistor N3 that equalizes the bit-line BL0 and the inverted bit-line /BL0 is arranged between the bit-line BL0 and the inverted bit-line /BL0. Accordingly, the width of the equalizing transistor N3 depends on a cell pitch, that is, the distance between the bit-line BL0 and the inverted bit-line /BL0, irrespective of the size of the sense amplifier including the bit-line equalizer 200.

With the development of improved performance of a semiconductor memory device, the operating speed of the semiconductor memory device is increased and, thus, it is necessary to reduce an equalizing time between a bit-line and an inverted bit-line. Furthermore, as the capacity of the semiconductor memory device increases, a memory cell size, that is, a cell pitch, of the semiconductor memory device decreases.

To reduce the equalizing time, the width of the equalizing transistor N3 has to be increased, however, the cell pitch is fixed. Thus, the equalizing time cannot be decreased when the layout illustrated in FIG. 2 is used.

Moreover, a parasitic transistor PATR, two of which are shown in FIG. 1, is formed between neighboring bit-lines BL0 and BL2, /BL0 and /BL2, BL2 and BL4, /BL2 and /BL4, ... when the layout illustrated in FIG. 2 is used. Each parasitic transistor PATR causes current leakage,

SUMMARY OF THE INVENTION

Exemplary embodiments of the present invention provide a bit-line equalizer capable of varying the width of an equalizing transistor irrespective of a memory cell pitch and a semiconductor memory device including the bit-line equalizer.

Exemplary embodiments of the present invention also provide a method for manufacturing a bit-line equalizer capable of varying the width of an equalizing transistor irrespective of a memory cell pitch.

According to an exemplary embodiment of the present invention, there is provided a bit-line equalizer precharging and/or equalizing bit-line pairs of a semiconductor memory device including: first and second polysilicon gates formed in a first direction in proximity to each other, the first and second polysilicon gates having a predetermined distance between them; and a plurality of equalizing transistors formed in a second direction along the first and second polysilicon gates, the equalizing transistors equalizing bit-line pairs the equalizing transistors being alternately formed in proximity to the first and second polysilicon gates.

The bit-line equalizer may further comprise at least one gate polysilicon tap formed between the first and second polysilicon gates to connect the first and second polysilicon gates to each other.

Each of the plurality of equalizing transistors may comprise a transistor active region and a gate electrode. The transistor active region is connected to a bit-line and an inverted bit-line forming a bit-line pair. The gate electrode is connected to the first or second polysilicon gate and formed on the transistor active region.

The widths of the transistor active region and the gate electrode may be variable in the second direction.

The transistor active region may be connected to the bit-line and the inverted bit-line through direct contacts.

The bit-line equalizer may further comprise a bit-line voltage active region formed between the first and second polysilicon gates.

The bit-line voltage active region may be connected to the transistor active region. The bit-line voltage active region, may be provided with a bit-line voltage through a direct contact.

The widths of the first and second polysilicon gates may be variable in the second direction.

The first and second directions may be perpendicular to each other. The first direction may correspond to a wordline direction of the semiconductor memory device, and the second direction may correspond to a bit-line direction of the semiconductor memory device.

According to an exemplary embodiment of the present invention, there is provided a bit-line equalizer precharging and/or equalizing bit-line pairs of a semiconductor memory device, including: first and second polysilicon gates formed in parallel with each other in a first direction, the first and second polysilicon gates having a predetermined distance between them; at least one gate polysilicon tap formed between the first and second polysilicon gates to connect the first and second polysilicon gates to each other; and a plurality of equalizing transistors formed in a second direction along the first and second polysilicon gates, the equalizing transistors equalizing bit-line pairs and being alternately formed in proximity to the first and second polysilicon gates, gate electrodes of the plurality of equalizing transistors being connected to the first or second polysilicon gate.

Each, of the plurality of equalizing transistors may comprise a transistor active region and a gate electrode. The transistor active region is connected to a bit-line and an inverted bit-line forming a bit-line pair. The gate electrode is formed on the transistor active region.

According to an exemplary embodiment of the present invention, there is provided a method for manufacturing a bit-line equalizer for precharging and/or equalizing bit-line pairs of a semiconductor memory device, including: forming a bit-line voltage active region in a first direction and forming transistor active regions of a plurality of equalizing transistors that equalize bit-line pairs respectively corresponding thereto, alternately at both sides of the bit-line voltage active region, in a second direction; forming first and second polysilicon gates in proximity to each other in the first direction having a predetermined distance between them such that the bit-line voltage active region is located between the first and second polysilicon gates, forming at least one gate polysilicon tap between the first and second polysilicon gates to connect the first and second polysilicon gates, and forming gate electrodes on the transistor active regions in the second direction; and forming direct contacts for connecting bit-lines and inverted bit-lines forming the bit-line pairs to the transistor active regions, and for supplying a bit-line voltage to the bit-line voltage active region.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
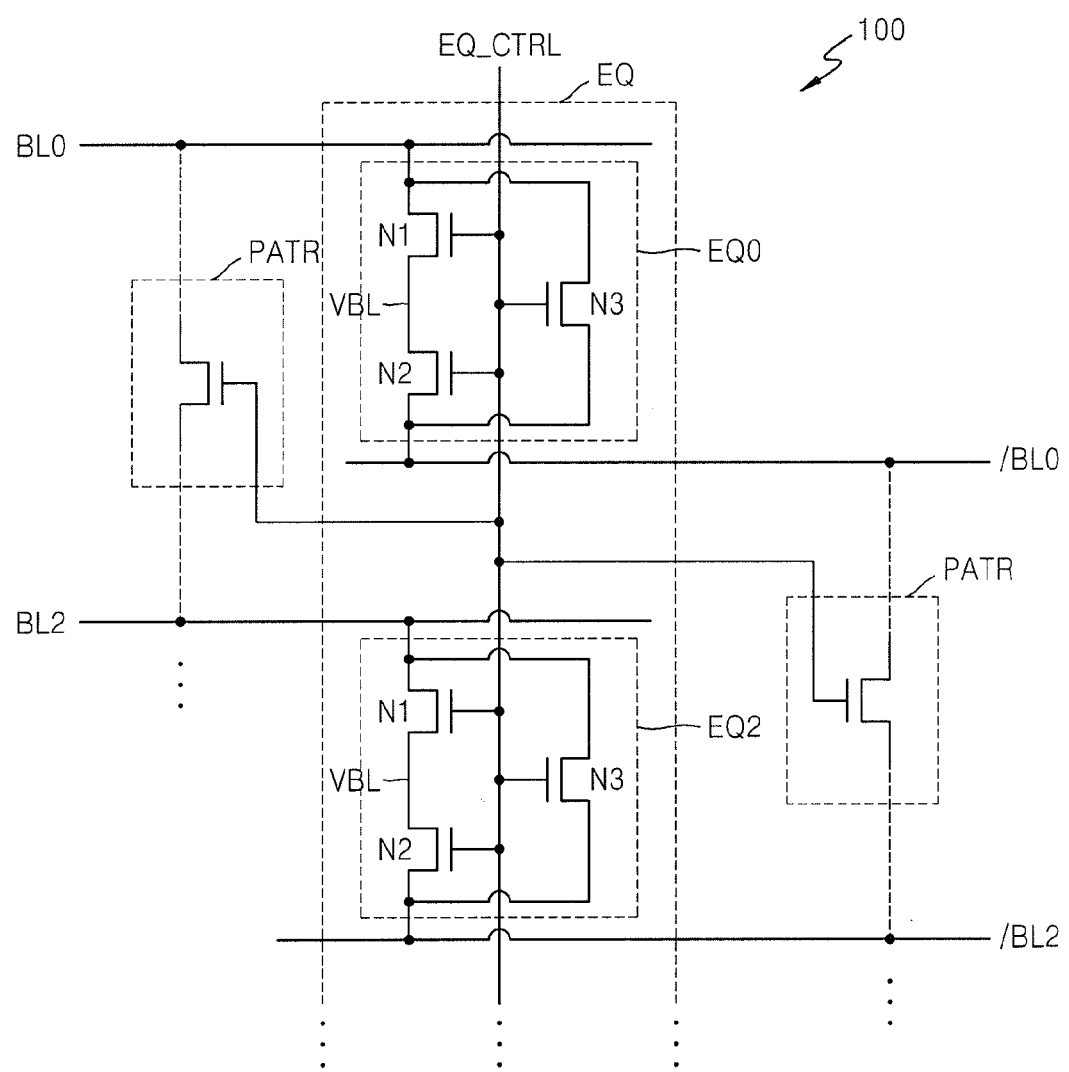
FIG. 1 is a circuit diagram of a conventional bit-line equalizer

Exemplary embodiments of the present invention will now be described more fully with reference to the accompanying drawings, in which the exemplary embodiments of the invention are shown. The invention may, however, be embodied in many different forms and should not be construed as being limited to the exemplary embodiments set forth herein; rather, these exemplary embodiments are provided so that this disclosure will be thorough and complete, and will fully convey the concept of the invention to those of ordinary skill in the art. Throughout the drawings, like reference numerals refer to like elements.

While the present invention will be described mainly around the operation of a bit-line equalizer that is included in a sense amplifier of a semiconductor memory device employing an open bit-line structure and equalizes bit-line pairs, it will be understood by those of ordinary skill in the art that the exemplary embodiments of the present invention do not limit the scope of the present invention. Furthermore, the operation of the bit-line equalizer according to the exemplary embodiments of the present invention is identical to the operation, of a conventional semiconductor memory device, except as specially mentioned.

Figure 3:
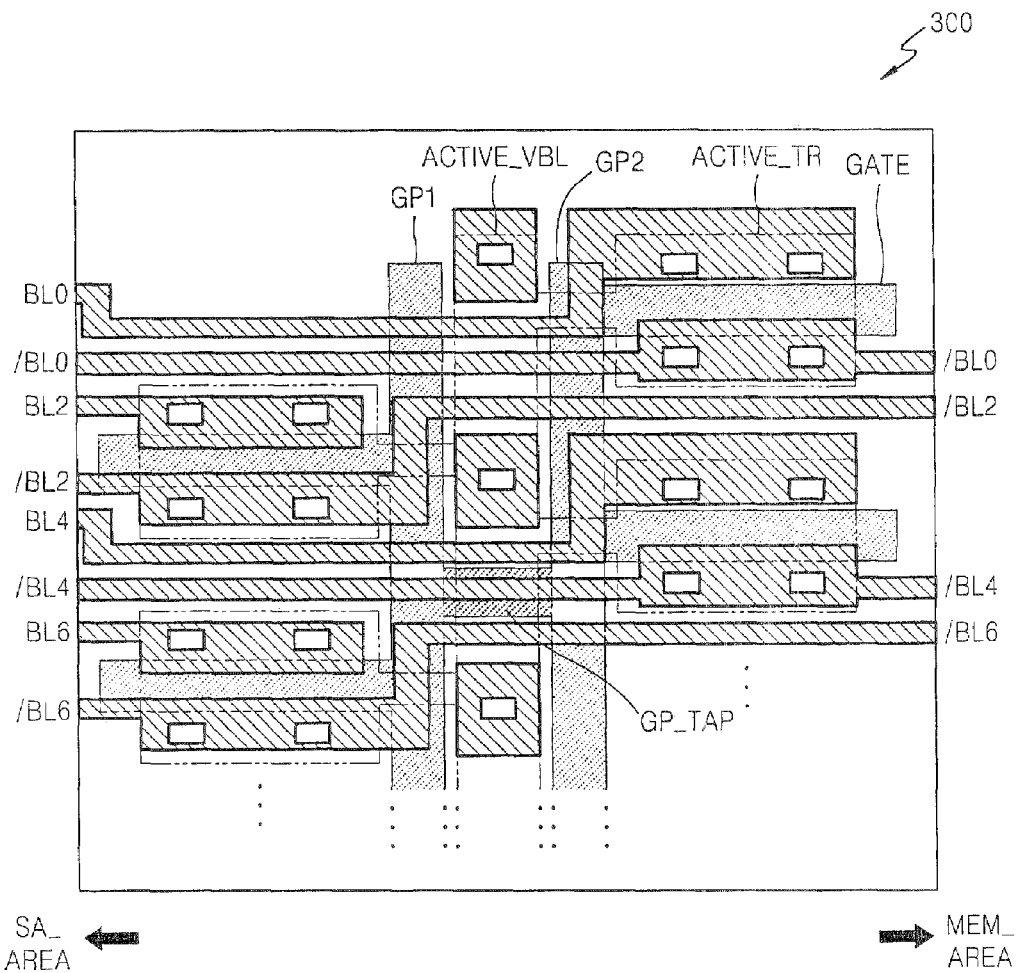
FIG. 3 is a layout of a bit-line equalizer according to an exemplary embodiment of the present invention.

FIG. 3 is a layout of a bit-line equalizer 300 according to an exemplary embodiment of the present invention. The bit-line equalizer 300 could be included in a sense amplifier (not shown). In FIG. 3, it is assumed that a memory cell array (not shown) is arranged on the right of the bit-line equalizer 300 and a sensing and amplification area is located on the left of the bit-line equalizer 300. In addition, it is assumed that inverted bit-lines /BL0, /BL2, . . . are connected to the memory cell array (not shown) located on the right of the inverted bit-lines /BL0, /BL2, . . . , and bit-lines BL0, BL2, . . . are connected to a memory cell array (not shown) located on the left of a sense amplifier (not shown) including the bit-line equalizer 300.

In FIG. 3, portions indicated by solid deviant lines correspond to conductive lines, portions indicated by dotted deviant lines correspond to polysilicon gates or gate electrodes, and portions defined by two-dot chain lines correspond to active regions. The structure of the bit-line equalizer 300 according to an exemplary embodiment of the present invention will be explained with reference to FIG. 3.

As described above, the bit-line equalizer 300 precharges and/or equalizes bit line pairs BL0 and /BL0, BL2 and / BL2, . . . of a semiconductor memory device (not shown). The bit-line equalizer 300 includes first and second polysilicon gates GP1 and GP2 and a plurality of equalizing transistors formed in transistor active regions ACTIVE_TR. Furthermore, the bit-line equalizer 300 may further include at least one gate polysilicon tap GP_TAP. The bit-line equalizer 300 may further include a bit-line voltage active region ACTIVE_VBL. The structure of the bit-line equalizer 300 including the at least one gate polysilicon tap GP_TAP or the bit-line voltage active region ACTIVE_VBL will be explained later.

The first and second polysilicon gates GP1 and GP2 are formed having a predetermined distance between them in a first direction, which is the vertical direction in FIG. 3. As illustrated in FIG. 3 in this exemplary embodiment, the first and second polysilicon gates GP1 and GP2 are arranged in proximity to each other and, more specifically, the first and second polysilicon gates GP1 and GP2 are arranged in parallel with each other.

While in this exemplary embodiment, the first direction corresponds to a wordline direction of memory cell arrays (not shown) of a semiconductor memory device (not shown), the present invention is not limited thereto.

An equalization control signal is applied to the first and second polysilicon gates GP1 and GP2.

The plurality of equalizing transistors equalize the bit-line pairs BL0 and /BL0, BL2 and /BL2, . . . respectively corresponding to the equalizing transistors. Referring to FIG. 3, the plurality of equalizing transistors are formed in the transistor active regions ACTIVE_TR in a second direction, which is the horizontal direction in FIG. 3, along the first and second polysilicon gates GP1 and GP2.

More specifically, the plurality of equalizing transistors are not formed between the first and second polysilicon gates GP1 and GP2, but they are alternately formed at the sides of the first and second polysilicon gates GP1 and GP2 in proximity to the first and second polysilicon gates GP1 and GP2. For example, an equalizing transistor equalizing the first bit-line pair BL0 and /BL0 is formed on the right of the second polysilicon gate GP2 and an equalizing transistor equalizing the second bit-line pair BL2 and /BL2 is formed on the left of the first polysilicon gate GP1. That is, equalizing transistors for equalizing odd-numbered bit-line pairs are formed on the right of the second polysilicon gate GP2 and equalizing transistors for equalizing even-numbered bit-line pairs are formed on the left of the first polysilicon gate GP1.

Each of the plurality of equalizing transistors includes a transistor active region ACTIVE_TR and a gate electrode GATE. The transistor active region ACTIVE_TR is connected to a bit-line and an inverted bit-line constructing a bit-line pair and forms a source and a drain of the equalizing transistor. The transistor active region ACTIVE_TR is connected to the bit-line and the inverted bit-line through direct contacts. In FIG. 3, the direct contacts are indicated by squares at portions where the transistor active region ACTIVE_TR is superposed on the bit-line and the inverted bit-line.

The gate electrode GATE is connected to the first or second polysilicon gate GP1 or GP2. The gate electrode GATE is connected to the first polysilicon gate GP1 when the equalizing transistor including the gate electrode GATE is formed on the left of the first polysilicon gate GP1, and the gate electrode GATE is connected to the second polysilicon gate GP2 when, the equalizing transistor is formed on the right of the second polysilicon gate GP1. Although the gate electrode GATE is formed on the transistor active region ACTIVE_TR in the exemplary embodiment, the present invention is not limited thereto.

As described above, the equalizing transistors according to the exemplary embodiment of the present invention are alternately arranged at the sides of the first and second polysilicon gates GP1 and GP2 and, thus, there is no fear of forming a parasitic transistor between a bit-line and an inverted bit-line. That is, bit-lines and/or inverted bit-lines are formed between neighbouring equalizing transistors and direct contacts are not formed in the bit-lines and/or inverted bit-lines, as illustrated in FIG. 3. Accordingly, a parasitic transistor is not formed in the bit-line equalizer according to the exemplary embodiment of the present invention.

Furthermore, terminals, that is, gates, drains and sources, of the equalizing transistors are formed in the second direction, as illustrated in FIG. 3. Thus, the width of the area where the equalizing transistors are formed can be varied by changing the size of the sense amplifier including the bit-line equalizer in the second direction.

That is, in the bit-line equalizer 300 according to the exemplary embodiment of the present invention, the widths of the transistor active region ACTIVE_TR and the gate electrode GATE of each equalizing transistor are variable in the second direction, which is the horizontal direction in FIG. 3, irrespective of a cell pitch, that is, the distance between a bit-line and an inverted bit-line. Accordingly, exemplary embodiments of the present invention can increase the width of an equalizing transistor and improve the equalizing time by increasing the area of the sense amplifier. Although the second direction is described as perpendicular to the first direction, the present invention is not limited thereto.

As described above, in the bit-line equalizer 300 according to the exemplary embodiment of the present invention, the first and second polysilicon gates GP1 and GP2 are formed in proximity to each other in the first direction to prevent the formation of a parasitic transistor and vary the widths of the equalizing transistors in response to the area of the sense amplifier.

Figure 2:
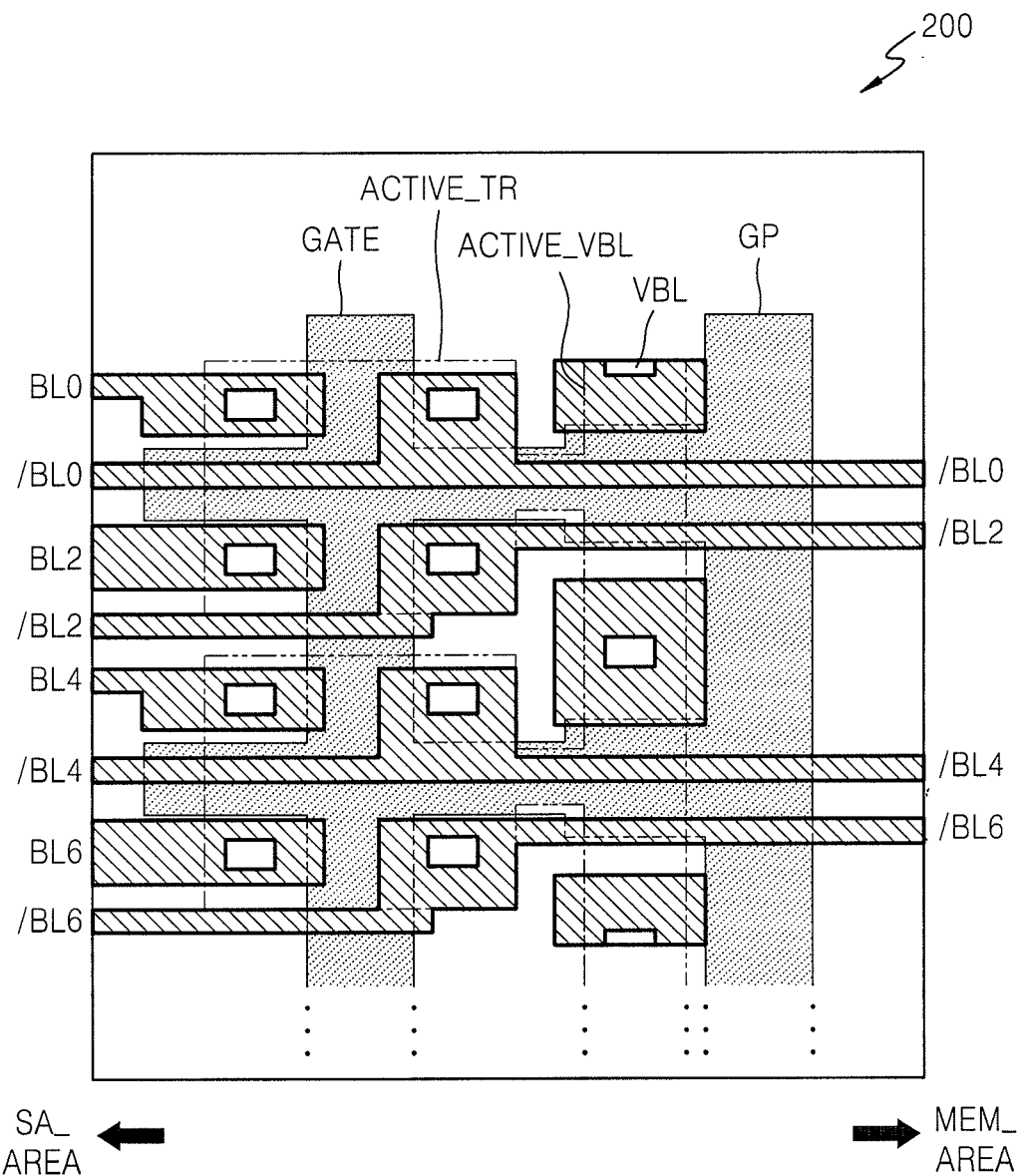
FIG. 2 is a layout of the bit-line equalizer illustrated in FIG. 1.

In this exemplary embodiment, the first and second polysilicon gates GP1 and GP2 have to have the same width as that of the polysilicon gate GP illustrated in FIG. 2 in order to play the same role as the polysilicon gate GP illustrated in FIG. 2. Thus, the area of the bit-line equalizer according to the exemplary embodiment of the present invention may increase. Furthermore, resistance to the equalization control signal applied to the first and second polysilicon gates GP1 and GP2 may increase because of two separate polysilicon gates GP1 and GP2.

Accordingly, an exemplary embodiment of the present invention connects the first and second polysilicon gates GP1 and GP2 using at least one gate polysilicon tap GP_TAP to reduce the widths of the first and second polysilicon gates GP1 and GP2 and to reduce the resistance to the equalization control signal.

As illustrated in FIG. 3, the bit-line equalizer 300 according to an exemplary embodiment of the present invention may further include the at least one gate polysilicon tap GP_TAP formed between the first and second polysilicon gates GP1 and GP2 to connect the first and second polysilicon gates GP1 and GP2 to each other.

In the exemplary embodiment of the present invention, the first and second polysilicon gates GP1 and GP2 are connected to each other using the at least one polysilicon tap GP_TAP, such that the first and second polysilicon gates GP1 and GP2 have a minimum width and, thus, the area of the sense amplifier including the bit-line equalizer 300 is reduced. Furthermore, the first and second polysilicon gates GP1 and GP2 can be varied in the second direction. Moreover, the first and second polysilicon gates GP1 and GP2 are connected to each other to reduce the resistance to the equalization control signal applied to the first and second polysilicon gates GP1 and GP2.

The bit-line equalizer according to an exemplary embodiment of the present invention may further include a bit-line voltage active region ACTIVE_VBL formed between the first and second polysilicon gates GP1 and GP2. The bit-line voltage active region ACTIVE_VBL is provided with a bit-line voltage through direct contacts formed in the bit-line voltage active region ACTIVE_VBL and indicated by squares in FIG. 3. Portions indicated by solid deviant lines in the bit-line voltage active region ACTIVE_VBL correspond to metal lines for supplying the bit-line voltage to the bit-line voltage active region ACTIVE_VBL.

The bit-line voltage active region ACTIVE_VBL is connected to the transistor active regions ACTIVE_TR and, thus, transistors (N1 and N2 illustrated in FIG. 1) for charging the bit-lines and the inverted bit-lines with the bit-line voltage are formed.

A method for manufacturing the bit-line equalizer according to an exemplary embodiment of the present invention will be explained, in the exemplary embodiments of the present invention, it is preferable to form active regions first, form polysilicon gates on the active regions, form metal lines including bit-lines, and then form direct contacts for connecting the active red on s to the metal lines.

More specifically, the bit-line voltage active region ACTIVE_VBL and the transistor active regions ACTIVE_TR are simultaneously formed. The bit-line voltage active region ACTIVE_VBL is formed in the first direction, which is the vertical direction in FIG. 3, that is, a word-line direction. The transistor active regions ACTIVE_TR form active regions of the plurality of equalizing transistors that equalize bit-line pairs respectively corresponding to the equalizing transistors. The transistor active regions ACTIVE_TR are alternately formed at both sides of the bit-line voltage active region ACTIVE_VBL in the second direction, which is the horizontal direction in FIG. 3, that is, a bit-line direction.

Then, the first and second polysilicon gates GP1 and GP2, the gate electrodes GATE and the gate polysilicon tap GP_TAP are formed. The first and second polysilicon gates GP1 and GP2 are formed having a predetermined distance between them in the first direction. The bit-line voltage active region ACTIVE_VBL is located between the first and second polysilicon gates GP1 and GP2.

The gate polysilicon tap GP_TAP is formed between, the first and second polysilicon gates GP1 and GP2 to connect the first and second polysilicon gates GP1 and GP2 to each other, in the exemplary embodiment, at least one gate polysilicon tap GP_TAP is formed. The gate electrodes GATE are formed on the transistor active regions ACTIVE_TR in the second direction. Subsequently, metal lines for forming bit-line pairs and metal lines for supplying the bit-line voltage are formed.

Finally, direct contacts for connecting bit-lines and inverted bit-lines constructing the bit-line pairs to the transistor active regions ACTIVE_TR and direct contacts for applying the bit-line voltage to the bit-line voltage active region are formed.

The structure and operation of the bit-line equalizer that is included in a sense amplifier of a semiconductor memory device using an open bit-line structure and precharges and/or equalizes bit-line pairs have been described in the exemplary embodiments of the present invention. It will be understood by those of ordinary skill in the art, however, that the bit-line equalizer according to an exemplary embodiment of the present invention can be used to precharge and/or equalize any arbitrary two signal lines.

Furthermore, while the bit-line equalizer is included in a sense amplifier in the exemplary embodiments of the present invention, it will be understood by those of ordinary skill in the art that the bit-line equalizer can be used to precharge and/or equalize bit-line pairs in a memory cell array and arbitrary signal line pairs including global input/output lines.

As described above, the bit-line equalizer according to the exemplary embodiments of the present invention can vary the width of an equalizing transistor irrespective of a memory cell pitch and, thus, an equalizing time can be improved. Furthermore, the bit-line equalizer according to the exemplary embodiments of the present invention can restrain the formation of a parasitic transistor between neighbouring bit-lines to prevent current leakage.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A bit-line equalizer precharging and/or equalizing bit-line pairs of a semiconductor memory device, comprising:
   first and second polysilicon gates formed in a first direction in proximity to each other, the first and second polysilicon gates having a predetermined distance therebetween; and
   a plurality of equalizing transistors formed in a second direction along the first and second polysilicon gates, the equalizing transistors equalizing bit-line pairs, with the equalizing transistors being alternately formed in proximity to the first and second polysilicon gates.

2. The bit-line equalizer of claim 1, further comprising at least one gate polysilicon tap formed between the first and second polysilicon gates to connect the first and second polysilicon gates to each other.

3. The bit-line equalizer of claim 1, wherein each of the plurality of equalizing transistors comprises:
   a transistor active region connected to a bit-line and an inverted bit-line forming a bit-line pair; and
   a gate electrode connected to one of the first and second polysilicon gates and formed on the transistor active region.

4. The bit-line equalizer of claim 3, wherein widths of the transistor active region and the gate electrode are variable in the second direction.

5. The bit-line equalizer of claim 3, wherein the transistor active region is connected to the bit-line and the inverted bit-line through direct contacts.

6. The bit-line equalizer of claim 3, further comprising a bit-line voltage active region formed between the first and second polysilicon gates, the bit-line voltage active region being connected to the transistor active region.

7. The bit-line equalizer of claim 6, wherein the bit-line voltage active region is provided with a bit-line voltage through a direct contact.

8. The bit-line equalizer of claim 1, wherein widths of the first and second polysilicon gates are variable in the second direction.

9. The bit-line equalizer of claim 1, wherein the first and second directions are perpendicular to each other.

10. The bit-line equalizer of claim 1, wherein the first direction corresponds to a wordline direction of the semiconductor memory device and the second direction corresponds to a bit-line direction of the semiconductor memory device.

11. A bit-line equalizer precharging and/or equalizing bit-line pairs of a semiconductor memory device, comprising:

first and second polysilicon gates formed in parallel with each other in a first direction, the first and second polysilicon gates having a predetermined distance therebetween;

at least one gate polysilicon tap formed, between the first and second polysilicon gates to connect the first and second polysilicon gates to each other; and a plurality of equalizing transistors formed in a second direction along the first and second polysilicon gates, the equalizing transistors equalizing bit-line pairs, with the equalizing transistors being alternately formed in proximity to the first and second polysilicon gates, gate electrodes of the plurality of equalizing transistors being connected to the first or second polysilicon gate.

12. The bit-line equalizer of claim 11, wherein each of the plurality of equalizing transistors comprises:

a transistor active region connected to a bit-line and an inverted bit-line forming a bit-line pair; and a gate electrode formed on the transistor active region.

13. The bit-line equalizer of claim 12, wherein the transistor active region and the width of the gate electrode are variable in the second direction.

14. The bit-line equalizer of claim 11, wherein widths of the first and second polysilicon gates are variable in the second direction.

15. A semiconductor memory device comprising:

first and second polysilicon gates formed in a first direction in proximity to each other, the first and second polysilicon gates having a predetermined distance therebetween; and a plurality of equalizing transistors formed in a second direction along the first and second polysilicon gates, the equalizing transistors equalizing bit-line pairs, with the equalizing transistors being alternately formed in proximity to the first and second polysilicon gates.

16. A method for manufacturing a bit-line equalizer precharging and/or equalizing bit-line pairs of a semiconductor memory device, comprising:

forming a bit-line voltage active region in a first direction and forming transistor active regions of a plurality of equalizing transistors that equalize bit-line pairs respectively corresponding thereto alternately at both sides of the bit-line voltage active region in a second direction;

forming first and second polysilicon gates in proximity to each other in the first direction having a predetermined distance therebetween such that the bit-line voltage active region is located between the first and second polysilicon gates, forming at least gate polysilicon tap between the first and second polysilicon gates to connect the first and second polysilicon gates, and forming gate electrodes on the transistor active regions in the second direction; and forming direct contacts for connecting bit-lines and inverted bit-lines forming the bit-line pairs to the transistor active regions, and for supplying a bit-line voltage to the bit-line voltage active region.

17. The method of claim 16, wherein the transistor active regions are connected to the bit-line voltage active region.

18. The method of claim 16, wherein the gate electrodes are connected to one of the first and second polysilicon gates.

19. The method of claim 16, wherein widths of the transistor active regions and the gate electrode are variable in the second direction.

20. The method of claim 16, wherein widths of the first and second polysilicon gates are variable in the second direction.

21. The method of claim 16, wherein the first and second directions are perpendicular to each other.

22. The method of claim 16, wherein the first direction corresponds to a wordline direction of the semiconductor memory device and the second direction corresponds to a bit-line direction, of the semiconductor memory device.

* * * * *